(12) United States Patent
Lesea

(10) Patent No.: US 7,852,108 B1
(45) Date of Patent: Dec. 14, 2010

(54) SINGLE EVENT UPSET RESILIENT PROGRAMMABLE INTERCONNECT

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/715,230

(22) Filed: Mar. 1, 2010

(51) Int. Cl.
*H03K 19/003* (2006.01)

(52) U.S. Cl. .......................... 326/15; 326/38

(58) Field of Classification Search ............ 326/9, 326/14, 15, 21, 26, 27, 37–41
See application file for complete search history.

(56) References Cited

U.S. PATENT DOCUMENTS

2007/0242537 A1* 10/2007 Golke et al. ................. 365/194
2008/0074145 A1* 3/2008 Sidhu et al. .................. 326/47
2009/0034312 A1* 2/2009 Lawrence et al. ............. 365/51

OTHER PUBLICATIONS

U.S. Appl. No. 12/354,202, filed Jan. 15, 2009, de Jong.

* cited by examiner

*Primary Examiner*—Don P Le
(74) *Attorney, Agent, or Firm*—LeRoy D. Maunu

(57) ABSTRACT

In one embodiment of the present invention, a programmable interconnect circuit is provided. The programmable interconnect circuit includes first and second static random access memory cells, each having a first output and a second output. The second output is an inversion of the first output. First and second pass gates are each coupled to one of the first and second outputs of the respective first and second memory cells. First and second lock-state circuits are coupled to the respective first and second memory cells. In response to a configuration status signal and the first output of one of the memory cells being asserted to a low voltage, the respective lock-state circuit is configured to maintain the one of the outputs of the respective memory cell at the low voltage.

20 Claims, 6 Drawing Sheets

SINGLE EVENT UPSET RESILIENT PROGRAMMABLE INTERCONNECT

FIELD OF THE INVENTION

The invention relates to programmable interconnect circuits such as those in programmable integrated circuits. More particularly, the invention relates to single event upsets in programmable interconnect circuits.

BACKGROUND

Programmable integrated circuits (ICs) are a well-known type of digital integrated circuit that can be programmed to perform specified logic functions. One type of programmable IC, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAM, and so forth).

The signals between the various logic blocks are interconnected through a programmable interconnect structure that includes a number of configurable interconnect signal lines. Logic blocks are connectable to specific interconnect signal lines using programmable interconnect circuits. One typical programmable interconnect circuit used to route a logic block output to a particular interconnect signal line is a pass gate multiplexer. A pass gate multiplexer includes a number of outputs that are each selectably coupled to an input through a pass gate. When a pass gate is turned on, an output is electrically coupled to the input. When the pass gate is turned off, the particular output is isolated from other outputs. By controlling the values on the gate terminals of the pass gates, circuit connections can easily be made and altered.

During operation, configuration data values stored in memory cells are used to control the operation of each programmable element. The logic blocks and interconnect routing of a programmable IC are configured by storing configuration data in configuration memory cells of each programmable element.

The versatility of reprogrammable ICs is advantageous in applications, such as aerospace, where remote reconfiguration is preferred over physical replacement. These types of applications may expose components to radiation, which can cause an error in a static random access memory (SRAM) cell. An error of this type is known as a single event upset (SEU) or soft error.

In many circuits, an SEU only has a transient effect following the particle strike and the variation will disappear in a time depending on the logic delay of the circuit. However, in circuits containing SRAM, an SEU occurring in an SRAM cell may cause the cell to change state and store an incorrect bit. When a single particle hits a memory cell, the resulting current pulse can trigger a transistor of the memory cell to pass current and invert the value stored in the memory cell. A stored high value can be inadvertently changed to a low value, and vice versa.

In a programmable IC, an SEU strike in a configuration memory cell can change the function of the programmed logic. For example, in a typical interconnect architecture of an FPGA, only one pass gate in a pass gate multiplexer is enabled at a given time. This restriction prevents shorts between signal lines. Depending on the particular memory cell that was struck, the upset may cause incorrect routing between logic blocks. In some instances, these "single event upsets" have no effect on the functionality of the chip, for example, when the static RAM cell controls a pass gate between two unused interconnect lines. In other occurrences, an SEU can change the functionality of a configured PLD such that the circuit no longer functions properly.

As operating voltages are reduced, SRAM cells used for configuration memory become more susceptible to changes in state caused by single event upsets. To reduce manufacturing costs, PLD manufacturers are aggressively reducing device sizes in programmable ICs. These smaller devices often operate at lower voltages with greater susceptibility to SEUs.

The present invention may address one or more of the above issues.

SUMMARY

In one embodiment, the present invention provides a static memory cell. The static memory cell includes first and second inverter circuits. Each inverter circuit includes a pull-up transistor of a first type and a pull-down transistor of a second type. In each inverter circuit, a gate of the pull-up transistor is coupled to a gate of the pull-down transistor forming a common gate. The pull-up and pull-down transistors are coupled in series to form an inverted output. The common gate of each inverter circuit coupled to the inverted output of the other inverter circuit. A write line enable circuit is coupled to the input of the first inverter circuit. The memory cells include a lock-state circuit having an input coupled to an configuration-status signal line. The lock-state circuit includes at least one selectably switched signal path coupled in parallel to one of the transistors of one of the first and second inverter circuits.

In another embodiment, the at least one selectably switched signal path includes a first selectably switched signal path coupled in parallel to the pull-up transistor of the first inverter circuit.

The at least one selectably switched signal path can include a first selectably switched signal path coupled in parallel to the pull-down transistor of the first inverter circuit in another embodiment of the static memory cell.

The at least one selectably switched signal path further can include a second selectably switched signal path coupled in parallel to the pull-up transistor of the second inverter circuit in yet another embodiment of the static memory cell.

In a further embodiment, the at least one selectably switched signal path further includes a second selectably switched signal path coupled in parallel to the pull-down transistor of the first inverter circuit.

The selectably switched signal path can be enabled by a logic gate in another embodiment. The logic gate has a first input coupled to the configuration-status signal line and a second input coupled to the output of one of the first and second inverter circuits.

In another embodiment, the selectably switched signal path includes a first transistor and a second transistor couple in series. The first transistor has a gate coupled to the configuration-status signal line, and the second transistor has a gate coupled to the output of one of the first and second inverter circuits.

In another embodiment, a single event upset resilient programmable integrated circuit (IC) is provided. The programmable IC includes a plurality of configurable logic circuits, a set of interconnect lines, and a plurality of programmable interconnect circuits. Each programmable interconnect circuit is configurable to couple one of the configurable logic circuits to one of the interconnect lines. Each of the plurality of programmable interconnect circuits includes a plurality of selectable switching circuits connected to a respective one of the interconnect lines. Each selectable switching circuit couples one of the configurable logic circuits to the respective interconnect line in response to being enabled by an associated memory cell. The associated memory cell includes a lock-state circuit, which selectably operates in one of a configuration mode and a run-time mode. While operating in the configuration mode, the lock-state circuit allows the memory cell to change state. While operating in the run-time mode, the lock-state circuit couples an output of the memory cell to a reference voltage to prevent the memory cell from changing state.

The lock-state circuit can include at least one selectably switched signal path coupled in parallel to a transistor of the memory cell in another embodiment. The at least one selectably switched signal path has a first end coupled to the output of the memory cell and a second end coupled to the reference voltage.

The selectably switched signal path is enabled by a logic gate in yet another embodiment. The logic gate has a first input coupled to the configuration-status signal line and a second input coupled to the output of the memory cell.

In another embodiment, the selectably switched signal path includes a first transistor and a second transistor coupled in series. The first transistor has a gate coupled to the configuration-status signal line, and the second transistor has a gate coupled to the output of the memory cell.

In another embodiment, each selectable switching circuit includes a plurality of selectably switched signal paths. The selectably switched signal paths are respectively coupled to others of the selectable switching circuits included in the programmable interconnect circuit. Each selectably switched signal path is enabled by the output of the associated memory cell of the respective selectable switching circuit.

In yet another embodiment, a programmable interconnect circuit is provided. The programmable interconnect circuit includes first and second static random access memory cells, each having a first output and a second output. The second output is an inversion of the first output. First and second pass gates are coupled to one of the first and second outputs of the respective first and second memory cells. First and second lock-state circuits are coupled to the respective first and second memory cells. In response to a configuration status signal and the first output of one of the memory cells being asserted to a low voltage, the respective lock-state circuit is configured to maintain the one of the outputs of the respective memory cell at the low voltage.

Each of the lock-state circuits, in another embodiment, includes a transistor arranged to electrically couple the first output of the respective memory cell to a reference voltage set at the low voltage in response to the configuration status signal and the first output of the respective memory cell being asserted to the low voltage.

In a further embodiment, each of the lock-state circuits includes a transistor arranged to electrically couple the first output of the respective memory cell to a reference voltage set at the low voltage in response to the configuration status signal and the second output of the respective memory cell being asserted to a high voltage.

Each of the lock-state circuits, in another embodiment, includes a transistor arranged to electrically couple the first output of the respective memory cell to a reference voltage set at a high voltage in response to the configuration status signal and the first output of the respective memory cell being asserted to the high voltage.

Each of the lock-state circuits, in yet another embodiment, includes a transistor arranged to electrically couple the first output of the respective memory cell to a reference voltage set at a high voltage in response to the configuration status signal and the second output of the respective memory cell being asserted to the low voltage.

In another embodiment, the first output of each of the memory cells outputs a value stored in the respective memory cell.

The first output of each of the memory cells can output an inverted value of a value stored in the respective memory cell in another embodiment.

In yet another embodiment, inputs of the first lock-state circuit are substantially electrically isolated from the first and second outputs of the second memory cell, and inputs of the second lock-state circuit are substantially electrically isolated from the first and second outputs of the first memory cell.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
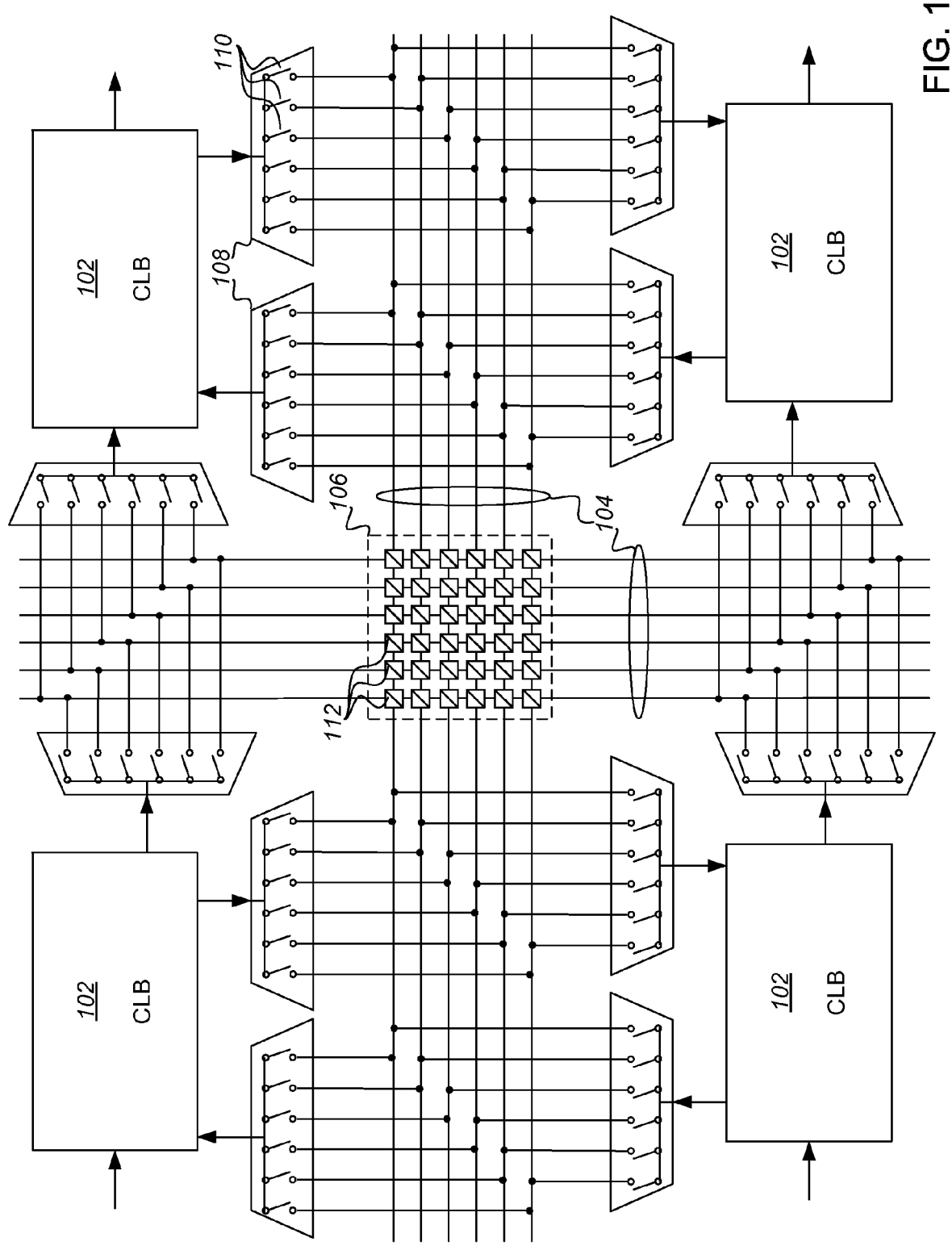
FIG. 1 illustrates an example interconnect architecture of a programmable integrated circuit.

In a typical interconnect architecture of a programmable IC, signals are routed between logic blocks though a number of interconnect signal lines. Logic blocks are coupled to specific signal lines during configuration using programmable interconnect circuits, such as pass gate multiplexers. Each pass gate of a multiplexer circuit is selectably enabled by a configuration memory cell. As used herein, a memory cell having a value that enables a pass gate is referred to as enabling and a memory cell having a value that disables a pass gate is referred to as non-enabling. In order to prevent shorts between interconnect signal lines, typically, only one pass gate in a pass gate multiplexer is enabled at a given time. When a single event upset (SEU) strikes configuration memory cells of a programmable interconnect circuit, two pass gates may become enabled.

The various embodiments of the present invention reduce the susceptibility of programmable interconnect circuits to SEUs by using locking circuitry to prevent non-enabling memory cells from changing to an enabling state after configuration has completed. If a single upset event occurs at any of the non-enabling memory cells, the value in the memory cell does not change, because the value of the memory cell is maintained by the locking circuit. The locking circuit will not prevent a single event upset from switching an enabling memory cell to a non-enabling memory cell. However, because the operation of the circuit only allows one circuit to be enabling, the susceptibility of the circuit is limited to the single enabling memory cell. Therefore, the susceptibility of the circuit structure is reduced by a factor of (N−1)/N, where N is the number of memory cells in the interconnect circuit.

In most programmable ICs, configuration memory is disconnected from programmable and interconnects during programming of configuration memory. A configuration status signal, referred to as "GHIGH" herein, is used to alert various hardware components when configuration of memory cells has started and completed. The GHIGH signal is used during configuration to disable input pins and to keep the programmable IC in a known, static state.

As described herein, during configuration of the memory cells GHIGH is asserted high. The logic and interconnects are isolated from the Look-Up Table (LUT) configuration memory cells and flip-flops (FFs). During this time, the LUT configuration memory cells and FFs are loaded with logical "1" or "0" values corresponding to respective high and low voltages. After the loading process is complete, the GHIGH signal is asserted low, causing the IC to couple the configuration memory to the logic blocks and interconnects.

The various embodiments of the present invention utilize the GHIGH signal to enable a lock-state circuit to fix the state of memory cell. As described herein, a memory cell has two values: a stored value 'Q' and a stored inverted value '$Q^{-1}$'. The inverted value $Q^{-1}$ may also be represented using the notations Q' or $\overline{Q}$. A signal referred to as asserted high or low, is also referred to as equal to logical "1" or "0," respectively, and such terminology is used interchangeably herein.

FIG. 1 shows a block diagram of an example programmable interconnect architecture in a programmable IC. In this example, the IC includes several logic blocks 102 having input and output signals routed over interconnect signal lines 104. Each input/output of a logic block 102 is programmably coupled to a selected one of the signal lines through a multiplexer 108. Each multiplexer contains a number of pass through gates 110. Each pass through gate is enabled or disabled according to a programmed value stored in an interconnect configuration memory cell (not shown). In some embodiments, signals may be routed between different sets of interconnect signal lines through a programmable switching matrix 106. The programmable switching matrix 106 includes a number of pass though gates 112, which selectably couple interconnect signal lines according to a programmed values stored in interconnect configuration memory cells (not shown). In this example, each multiplexer contains six pass gates 110 to selectably couple to one of six interconnect signal lines 104. Six interconnect memory cells would be used for configuration of each multiplexer 108. Although the various embodiments of the invention are described mainly in terms of a multiplexer circuit, the invention is not so limited and is applicable to various different programmable interconnect resources including but not limited to, interconnect multiplexers and programmable switching matrices.

Figure 2:
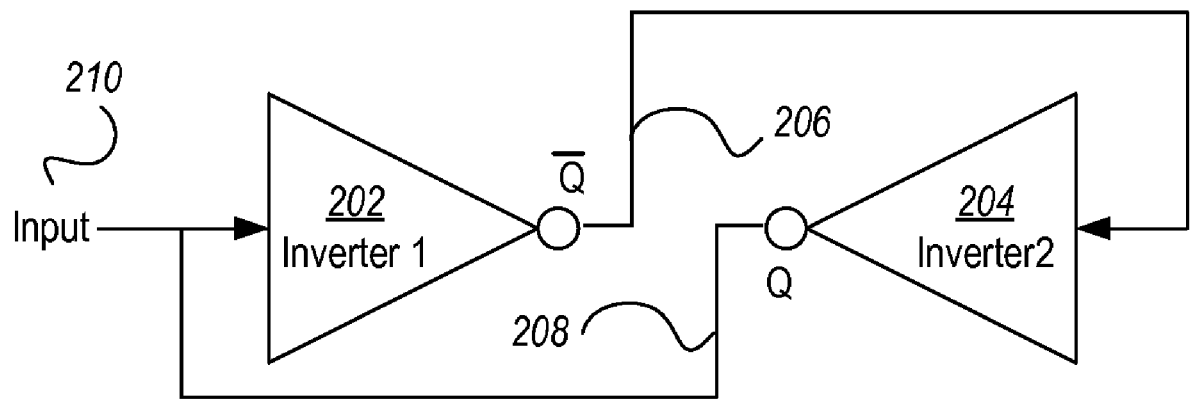
FIG. 2 shows a block diagram of a memory cell composed of two cross-coupled inverters.

Although a number of different memory cell structures may be used, for simplicity, the various embodiments disclosed herein are described in terms of SRAM memory. An SRAM cell generally stores a bit using two cross-coupled inverters. FIG. 2 shows two inverters in a cross-coupled arrangement. The inverted output $Q^{-1}$ 206 of a first inverter 202 is used as input to a second inverter 104. The second inverter 204 reverts the inverted output $Q^{-1}$ 206 of the first inverter to the originally stored value Q 208. The output of the second inverter is input to the first inverter to maintain the inverters in a constant state once input 210 is removed. In this manner, a bit can be stored in the circuit.

The value stored in the memory cell can be changed by modifying the input to either inverter. Therefore, the value of a memory cell can be maintained by pulling the input to either inverter up or down appropriately. The present invention adds lock-state circuits to the output of each of the memory cells to lock each memory cell storing a zero.

In one embodiment of the invention, a lock-state circuit is coupled to each memory cell of the programmable interconnect. The lock-state circuit is configured and coupled to actively pull the Q value down to a low value, after Q and GHIGH signals are asserted low. The lock-state circuit maintains active pull down of the Q signal until the programmable IC enters configuration mode and GHIGH is asserted high.

Figure 3:
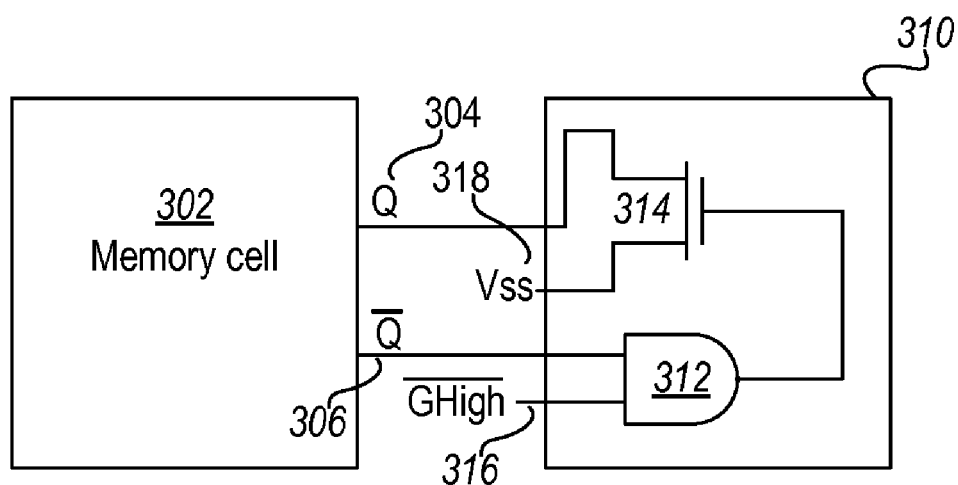
FIGS. 3, 4, 5, and 6 show circuit diagrams of a memory cell and lock-state circuit implemented in accordance with various embodiments of the invention.

FIG. 3 shows a block diagram of an example implementation of a lock-state circuit coupled to a memory cell in accordance with several embodiments of the invention. Memory cell 302 has a terminal providing stored value Q 304 and a terminal providing the inverted value $Q^{-1}$ 306. When enabled, lock-state circuit 310 pulls the Q signal 304 down to an asserted low value Vss 318 with NMOS transistor 314. In this implementation, NMOS transistor 314 is activated by AND gate 312, which asserts a high signal when GHIGH$^{-1}$ 316 and inverted value $Q^{-1}$ 306 are asserted high. Table 1 shows a truth table of the logic implemented by the lock-state circuit 310.

TABLE 1

| $G_{high}^{-1}$ | $Q^{-1}$ | AND | NMOS |
|---|---|---|---|
| 0 | 0 | 0 | Off |
| 0 | 1 | 0 | Off |
| 1 | 0 | 0 | Off |
| 1 | 1 | 1 | On |

During configuration of the programmable IC, GHIGH$^{-1}$ 316=0, causing AND gate output to be=0. As a result, transistor 314 will be 'off' and the memory cell 302 can be programmed to store any value without Q 304 being pulled down to a low state.

After configuration completes, GHIGH$^{-1}$ is asserted high. If the inverted value $Q^{-1}$ 306 equals '0', AND gate output is set to '0' and transistor 314 will remain 'Off'. If the inverted value $Q^{-1}$ 306 is set or becomes equal to '0', AND gate outputs a signal equal to '1' and transistor 314 will switch 'On'. While transistor 314 is on, Q 304 is actively pulled down, effectively preventing Q from switching high if an SEU occurs.

Figure 4:
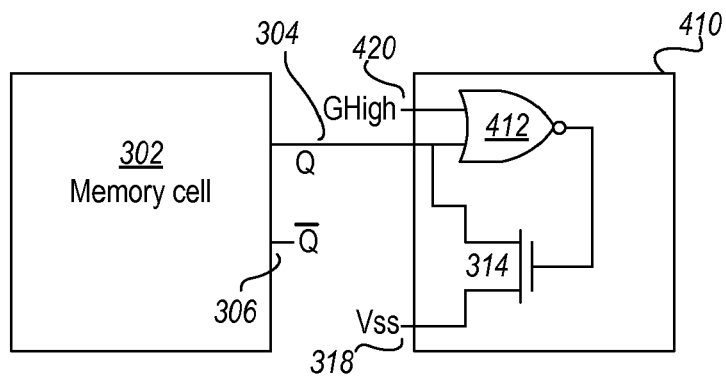

It is understood that various different logic gates can be used to enable the NMOS transistor 314. FIG. 4 shows a block diagram of the memory cell and lock-state circuit arrangement of FIG. 3 with NMOS transistor 314 enabled by an NOR gate 412. In this example implementation, NOR gate 412 is coupled to receive Q 304 and GHIGH 420 signals as input. NOR gate asserts a high signal when GHIGH 420 and stored value Q 304 are both asserted low. Table 2 shows a truth table of the logic implemented by the lock-state circuit 410.

TABLE 2

| $G_{high}$ | Q | NOR | NMOS |
|---|---|---|---|
| 1 | 1 | 0 | Off |
| 1 | 0 | 0 | Off |
| 0 | 1 | 0 | Off |
| 0 | 0 | 0 | On |

During configuration of the programmable IC, GHIGH 420='0', which causes NOR gate 412 output to be=0. As a result, transistor 314 will be 'Off' and the memory cell 302 can be set to store any value without Q 304 being pulled down to the low state.

After configuration completes, GHIGH 420 equals '0'. If the stored value Q 304 equals '1', NOR gate 412 outputs a signal equal to '0' and transistor 314 will remain 'off'. If the store value Q 304 is set or becomes equal to '0', NOR gate outputs a signal equal to '1' and transistor 314 will switch 'on'. While transistor 314 is 'on', Q 304 is actively pulled down, effectively preventing Q 304 from switching high if an SEU occurs. Those skilled in the art will recognize that numerous other logic gates and transistors types can be used to fix the stored value of the memory cell in the manner described.

Figure 5:
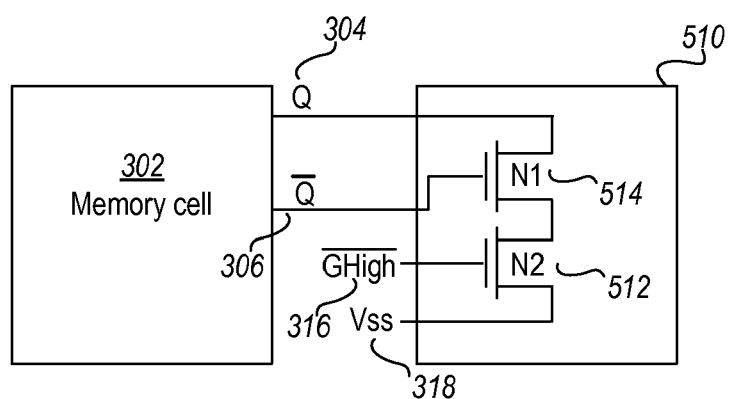

In some embodiments of the invention, the lock-state circuit can be implemented without use of a logic gate to enable the transistor. FIG. 5 shows a block diagram of the memory cell and lock-state circuit arrangement of FIG. 3 with pull down of the Q signal implemented with two NMOS transistors. In this example implementation, transistors 512 and 514 are coupled in series between the Q signal 304 and low state value Vss 318. One transistor 512 is enabled by $GHIGH^{-1}$ 316 and the other transistor 514 is enabled by $Q^{-1}$ 306. Q signal 304 will be pulled down when both transistors are enabled. Table 3 shows a truth table of the logic implemented by the lock-state circuit 510.

TABLE 3

| $G_{high}^{-1}$ | $Q^{-1}$ | N1 | N2 |
|---|---|---|---|
| 0 | 0 | Off | On |
| 0 | 1 | Off | Off |
| 1 | 0 | On | On |
| 1 | 1 | On | Off |

During configuration of the programmable IC, $GHIGH^{-1}$ 316=0, causing transistor N1 (514) to be 'off'. The memory cell 302 can be to store any value without Q 304 being pulled down to a low state.

After configuration completes, $GHIGH^{-1}$ is asserted high, turning transistor N1 (514) 'on'. If the inverted value $Q^{-1}$ 306='0', transistor 512 will remain 'off'. If the inverted value $Q^{-1}$ 306 is set or becomes equal to '1', transistor 512 will turn 'on' providing a path between Q 304 and low state voltage Vss 318. While transistor 512 remains enabled, Q 304 is actively pulled down, effectively preventing Q from switching high if an SEU occurs.

Figure 6:
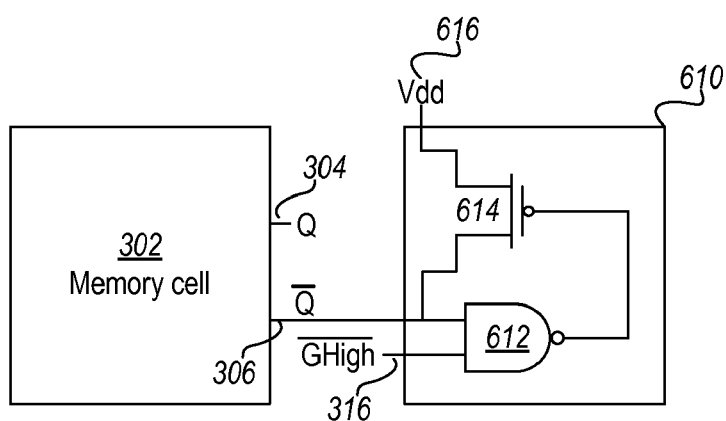

In some embodiments of the invention, the value of Q is locked low by pulling the inverted value $Q^{-1}$ to an asserted high value. FIG. 6 shows a block diagram of an example implementation of a lock-state circuit coupled and arranged to fix the state of the memory cell shown in FIG. 3 by adjusting the inverted stored value $Q^{-1}$. In this implementation, PMOS transistor 614 is activated by NAND gate 612, which asserts a high signal when $GHIGH^{-1}$ 316 and inverted value $Q^{-1}$ 306 are asserted high. Table 4 shows a truth table of the logic implemented by the lock-state circuit 610.

TABLE 4

| $G_{high}^{-1}$ | $Q^{-1}$ | NAND | PMOS |
|---|---|---|---|
| 0 | 0 | 1 | Off |
| 0 | 1 | 1 | Off |
| 1 | 0 | 1 | Off |
| 1 | 1 | 0 | On |

During configuration of the programmable IC, $GHIGH^{-1}$ 316=0, causing NAND gate output to equal 1. As a result, PMOS transistor 314 will be 'off' and the memory cell 302 can be to store any value without Q 304 being pulled down to a low state.

After configuration completes, $GHIGH^{-1}$ is asserted high. If the inverted value $Q^{-1}$ 306 equal to '0', NAND gate 612 output equals '1' and PMOS transistor 614 will remain 'off'. If the inverted value $Q^{-1}$ 306 is set or becomes equal to '1', NAND gate outputs a signal equal to '0' and PMOS transistor 614 will switch 'on'. While PMOS transistor 614 is 'on', $Q^{-1}$ 306 is actively pulled up to high voltage Vdd 616, effectively preventing Q from switching high if an SEU occurs.

Although the various embodiments above are primarily described in terms of lock-state circuitry external to a memory cell, the lock-state circuit can easily be incorporated into the structure of the memory cell.

Figure 7:
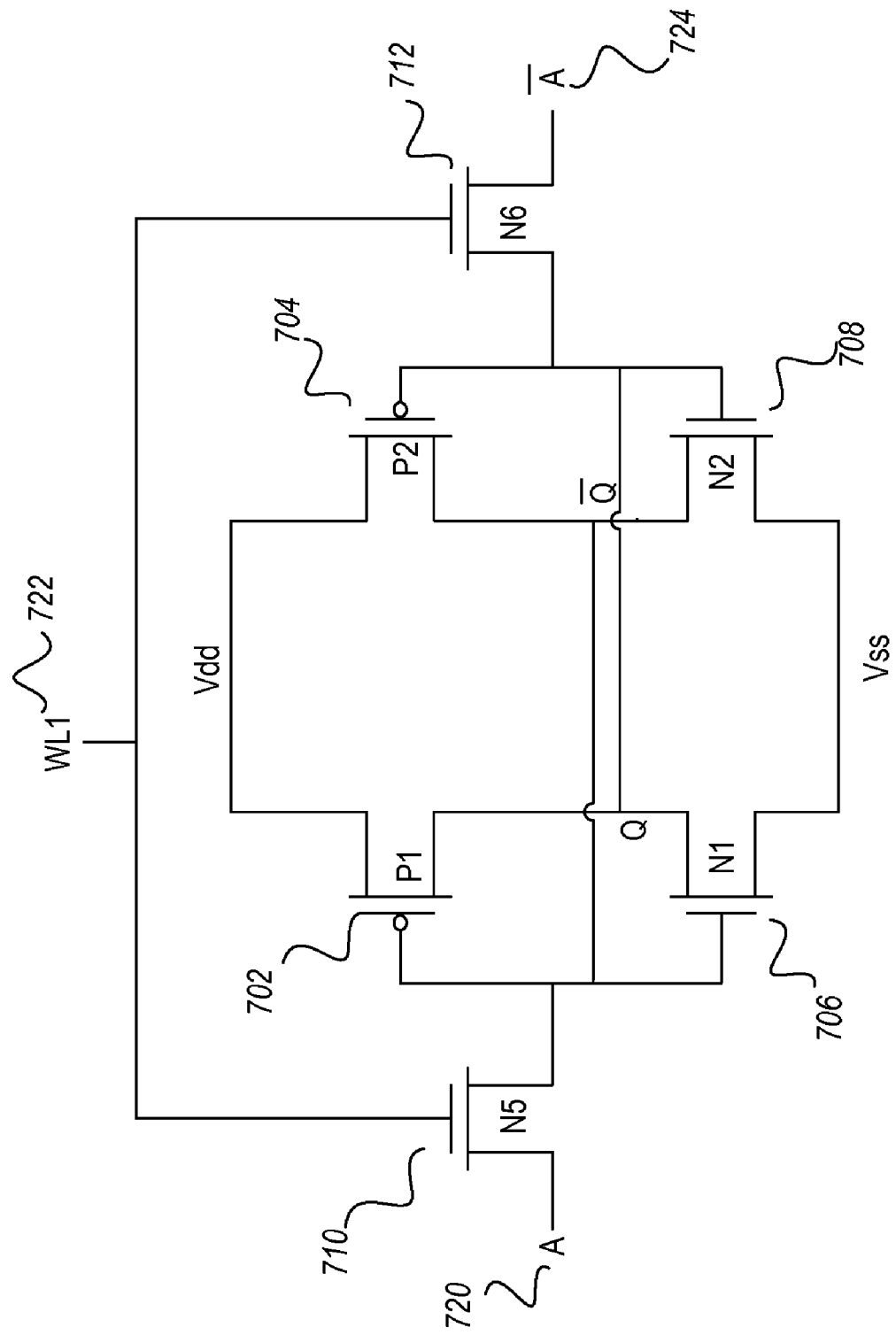
FIG. 7 shows a circuit diagram of a six transistor (6T) SRAM cell.

FIG. 7 shows a typical six transistor (6T) SRAM cell. The memory cell includes a first inverter, including transistors 702 and 706, cross-coupled with a second inverter, including transistors 704 and 708. Transistors 710 and 712 are respectively coupled to signal lines 720 and 724 to control read/write access to the cell. During a read or write of the cell, transistors 710 and 712 are enabled by write line 722. Signal line 720 is set to an inverted complement of signal line 724. Although it is not strictly necessary to have two signal lines, both the signal and its inverse are typically provided in order to improve noise margins. Signals lines are also referred to as bit-lines and such terms are used interchangeably herein.

Figure 8:
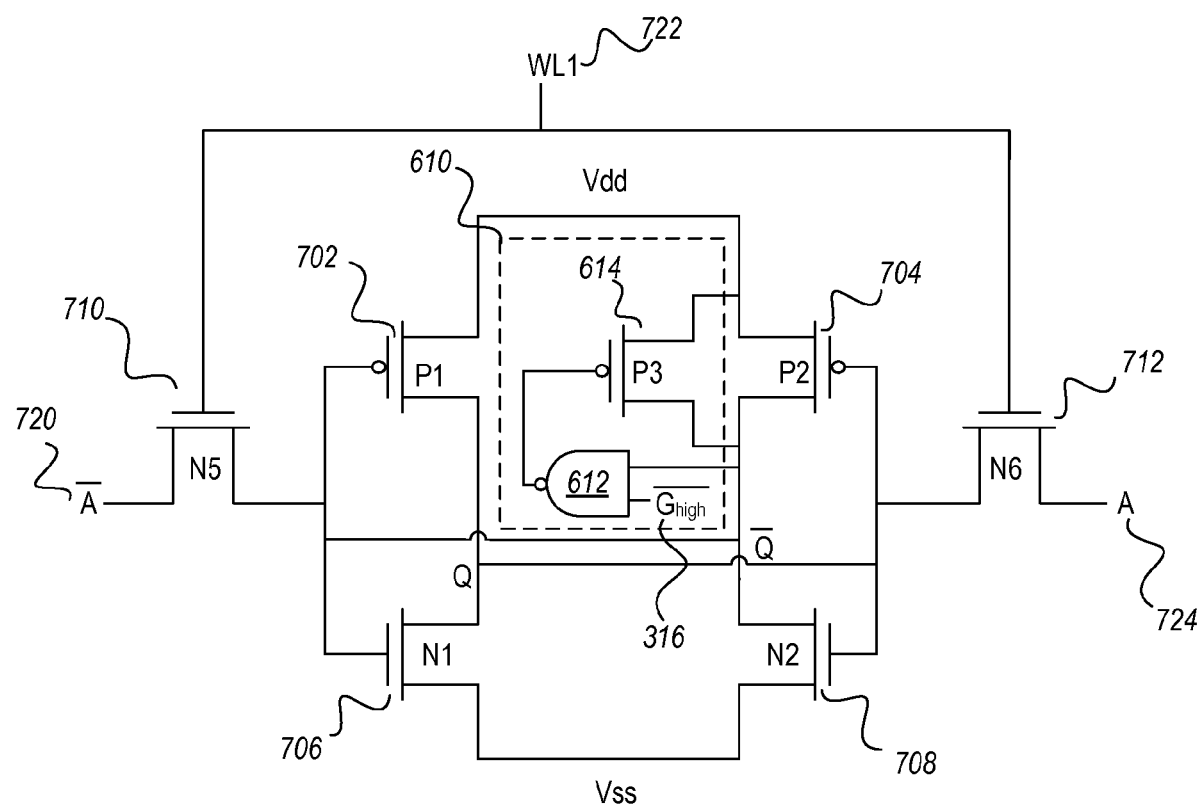
FIG. 8 shows a circuit diagram of the lock-state circuitry of FIG. 6 incorporated in a 6T SRAM cell.

FIG. 8 shows the 6T SRAM cell of FIG. 7 adapted with the lock-state circuit shown in FIG. 6. As described in FIG. 6, PMOS transistor 614 is activated by NAND gate 612, which asserts a high signal when $GHIGH^{-1}$ 316 and inverted value $Q^{-1}$ 306 are asserted high. After configuration has been completed and $GHIGH^{-1}$ 316 equals '1', if Q equals '0', the PMOS transistor 614 will be enabled and will actively pull $Q^{-1}$ up to Vdd voltage.

Figure 9:
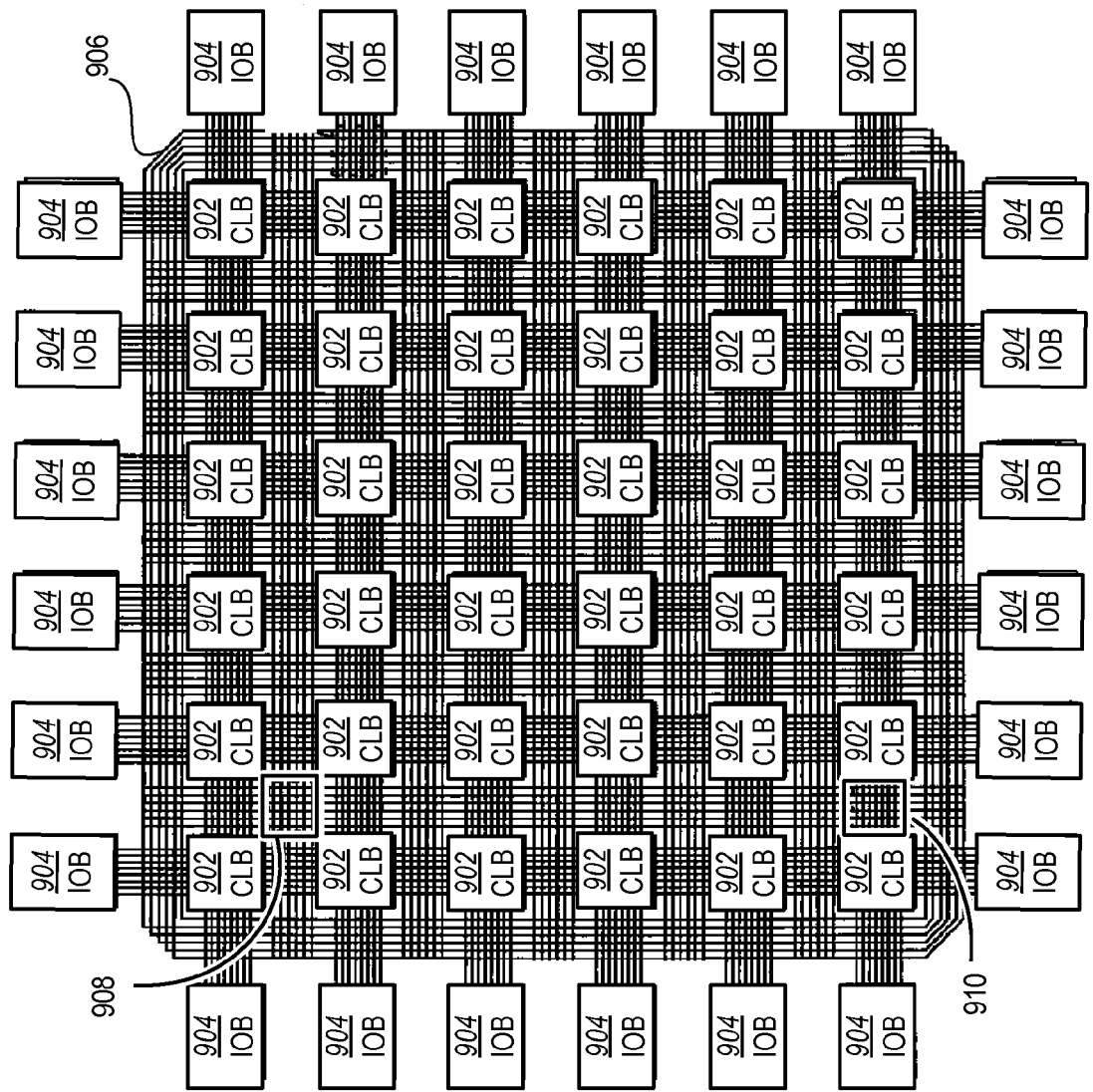
FIG. 9 shows a block diagram of an example programmable IC that may be implemented with lock-state interconnects in accordance with various embodiments of the invention.

FIG. 9 shows a block diagram of an example programmable IC that may be implemented in accordance with various embodiments of the invention. Logic blocks 902 are dispersed in a two-dimensional array and interconnected by a programmable interconnect structure. Input/output blocks (IOBs) 904 are disposed in a ring around the array of function blocks. Note that the number of logic blocks and IOBs shown in FIG. 9 is exemplary, and any number of these elements can be included. Similarly, the number of interconnect lines shown between the rows and columns of function blocks is purely exemplary, and can be any desired number. For simplicity, six interconnect lines 906 are shown between each row and column of logic blocks 902.

The interconnect structure illustrated in FIG. 9 includes horizontal and vertical segmented interconnect lines. At the point of intersection between the horizontal and vertical interconnect lines are programmable interconnect switch matrices 908. A programmable switch matrix can be programmed, for example, to couple together a horizontal interconnect line to a vertical interconnect line or an adjacent segment of the horizontal interconnect line segment (e.g., sharing the same horizontal "routing track").

The segmented interconnect lines can be all of one length, or of different lengths. For example, some of the interconnect lines can span one function block, while others span two or more function blocks. In some embodiments, the interconnect lines span one, two, three, and six function blocks. In some embodiments, some of the interconnect lines span an entire column or row of function blocks, while others span one half or one quarter of a column or row. Many other combinations of interconnect line lengths can also be used.

The interconnect structure illustrated in FIG. 9 also includes a number of programmable interconnect multiplexer circuits 910 that can include, for example, a number of interconnect multiplexers (108 as shown in FIG. 1). The programmable multiplexer circuits are use to couple inputs of output of logic blocks 902 and IOBs 904 to the signal interconnect lines 906.

The present invention is thought to be applicable to a variety of interconnect architectures and circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims and their equivalents.

What is claimed is:

1. A static memory cell, comprising:
    first and second inverter circuits, each inverter circuit including a pull-up transistor of a first type and a pull-down transistor of a second type;
    wherein in each inverter circuit, a gate of the pull-up transistor is coupled to a gate of the pull-down transistor forming a common gate, the pull-up and pull-down transistors are coupled in series to form an inverted output, and the common gate of each inverter circuit is coupled to the inverted output of the other inverter circuit;
    a write line enable circuit coupled to the input of the first inverter circuit; and
    a lock-state circuit including:
        an input coupled to a configuration-status signal line; and
        at least one selectably switched signal path coupled in parallel to one of the transistors of one of the first and second inverter circuits.

2. The static memory cell of claim 1, wherein the at least one selectably switched signal path includes a first selectably switched signal path coupled in parallel to the pull-up transistor of the first inverter circuit.

3. The static memory cell of claim 1, wherein the at least one selectably switched signal path includes a first selectably switched signal path coupled in parallel to the pull-down transistor of the first inverter circuit.

4. The static memory cell of claim 2, wherein the at least one selectably switched signal path further includes a second selectably switched signal path coupled in parallel to the pull-up transistor of the second inverter circuit.

5. The static memory cell of claim 2, wherein the at least one selectably switched signal path further includes a second selectably switched signal path coupled in parallel to the pull-down transistor of the first inverter circuit.

6. The static memory cell of claim 1, wherein the selectably switched signal path is enabled by a logic gate, the logic gate having a first input coupled to the configuration-status signal line and a second input coupled to the output of one of the first and second inverter circuits.

7. The static memory cell of claim 1, wherein the selectably switched signal path includes a first transistor and a second transistor couple in series, the first transistor having a gate coupled to the configuration-status signal line and the second transistor having a gate coupled to the output of one of the first and second inverter circuits.

8. A single event upset resilient programmable integrated circuit, comprising:
    a plurality of configurable logic circuits;
    a set of interconnect lines; and
    a plurality of programmable interconnect circuits, wherein each programmable interconnect circuit is configurable to couple one of the configurable logic circuits to one of the interconnect lines;
    wherein:
        each of the plurality of programmable interconnect circuits includes a plurality of selectable switching circuits connected to respective ones of the interconnect lines, each selectable switching circuit coupling one of the configurable logic circuits to the respective interconnect line in response to being enabled by an associated memory cell;
        the associated memory cell includes a lock-state circuit, and the lock-state circuit selectably operates in one of a configuration mode and a run-time mode;
        while operating in the configuration mode, the lock-state circuit allows the memory cell to change state; and
        while operating in the run-time mode, the lock-state circuit couples an output of the memory cell to a reference voltage to prevent the memory cell from changing state.

9. The programmable integrated circuit of claim 8, wherein the lock-state circuit includes at least one selectably switched signal path coupled in parallel to a transistor of the memory cell, the at least one selectably switched signal path having a first end coupled to the output of the memory cell and a second end coupled to the reference voltage.

10. The programmable integrated circuit of claim 9, wherein the selectably switched signal path is enabled by a logic gate, the logic gate having a first input coupled to the configuration-status signal line and a second input coupled to the output of the memory cell.

11. The programmable integrated circuit of claim 9, wherein the selectably switched signal path includes a first transistor and a second transistor coupled in series, the first transistor having a gate coupled to the configuration-status signal line and the second transistor having a gate coupled to the output of the memory cell.

12. The programmable integrated circuit of claim 9, wherein:
    each selectable switching circuit includes a plurality of selectably switched signal paths respectively coupled to others of the selectable switching circuits included in the programmable interconnect circuit; and
    each selectably switched signal path is enabled by the output of the associated memory cell of the respective selectable switching circuit.

13. A programmable interconnect circuit, comprising:
    first and second static random access memory cells, each having a first output and a second output, the second output being an inversion of the first output;
    first and second pass gates coupled to one of the first and second outputs of the respective first and second memory cells; and
    first and second lock-state circuits coupled to the respective first and second memory cells;
    wherein in response to a configuration status signal and the first output of one of the first and second memory cells being asserted to a low voltage, the respective lock-state circuit is configured to maintain the one of the outputs of the respective memory cell at the low voltage.

14. The programmable interconnect circuit of claim 13, wherein each of the lock-state circuits includes a transistor arranged to electrically couple the first output of the respective memory cell to a reference voltage set at the low voltage in response to the configuration status signal and the first output of the respective memory cell being asserted to the low voltage.

15. The programmable interconnect circuit of claim 13, wherein each of the lock-state circuits includes a transistor arranged to electrically couple the first output of the respective memory cell to a reference voltage set at the low voltage in response to the configuration status signal and the second output of the respective memory cell being asserted to a high voltage.

16. The programmable interconnect circuit of claim 13, wherein each of the lock-state circuits includes a transistor arranged to electrically couple the first output of the respective memory cell to a reference voltage set at a high voltage in response to the configuration status signal and the first output of the respective memory cell being asserted to the high voltage.

17. The programmable interconnect circuit of claim 13, wherein each of the lock-state circuits includes a transistor arranged to electrically couple the first output of the respective memory cell to a reference voltage set at a high voltage in response to the configuration status signal and the second output of the respective memory cell being asserted to the low voltage.

18. The programmable interconnect circuit of claim 13, wherein the first output of each of the memory cells outputs a value stored in the respective memory cell.

19. The programmable interconnect circuit of claim 13, wherein the first output of each of the memory cells outputs an inverted value of a value stored in the respective memory cell.

20. The programmable interconnect circuit of claim 13, wherein:
  inputs of the first lock-state circuit are substantially electrically isolated from the first and second outputs of the second memory cell; and
  inputs of the second lock-state circuit are substantially electrically isolated from the first and second outputs of the first memory cell.

\* \* \* \* \*